(12) United States Patent
Adams et al.

(10) Patent No.: US 6,803,780 B2
(45) Date of Patent: Oct. 12, 2004

(54) SAMPLE CHUCK WITH COMPOUND CONSTRUCTION

(75) Inventors: Michael John Adams, Olmstead Falls, OH (US); William H. Howland, Jr., Wexford, PA (US); William J. Alexander, Pittsburgh, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 40 days.

(21) Appl. No.: 10/139,685

(22) Filed: May 3, 2002

(65) Prior Publication Data

US 2003/0011392 A1 Jan. 16, 2003

Related U.S. Application Data

(60) Provisional application No. 60/304,325, filed on Jul. 10, 2001.

(51) Int. Cl.$^7$ ................................................. G10R 31/02
(52) U.S. Cl. .......................................... 324/755; 324/766
(58) Field of Search ............................. 324/755, 158.1, 324/763, 765, 766, 514, 759, 769, 76.11, 754; 438/118, 126

(56) References Cited

U.S. PATENT DOCUMENTS 6,365,436 B1 * 4/2002 Faraci ........................ 438/113

* cited by examiner

Primary Examiner—Danil A. Zaneke
Assistant Examiner—Trung Q. Nguyen
(74) Attorney, Agent, or Firm—Webb Ziesenheim Logsdon Orkin & Hanson, P.C.

(57) ABSTRACT

A sample chuck for supporting sample semiconductor wafers during testing includes an upper layer formed from a semiconducting material laminated to a lower layer formed from a conducting material.

9 Claims, 1 Drawing Sheet

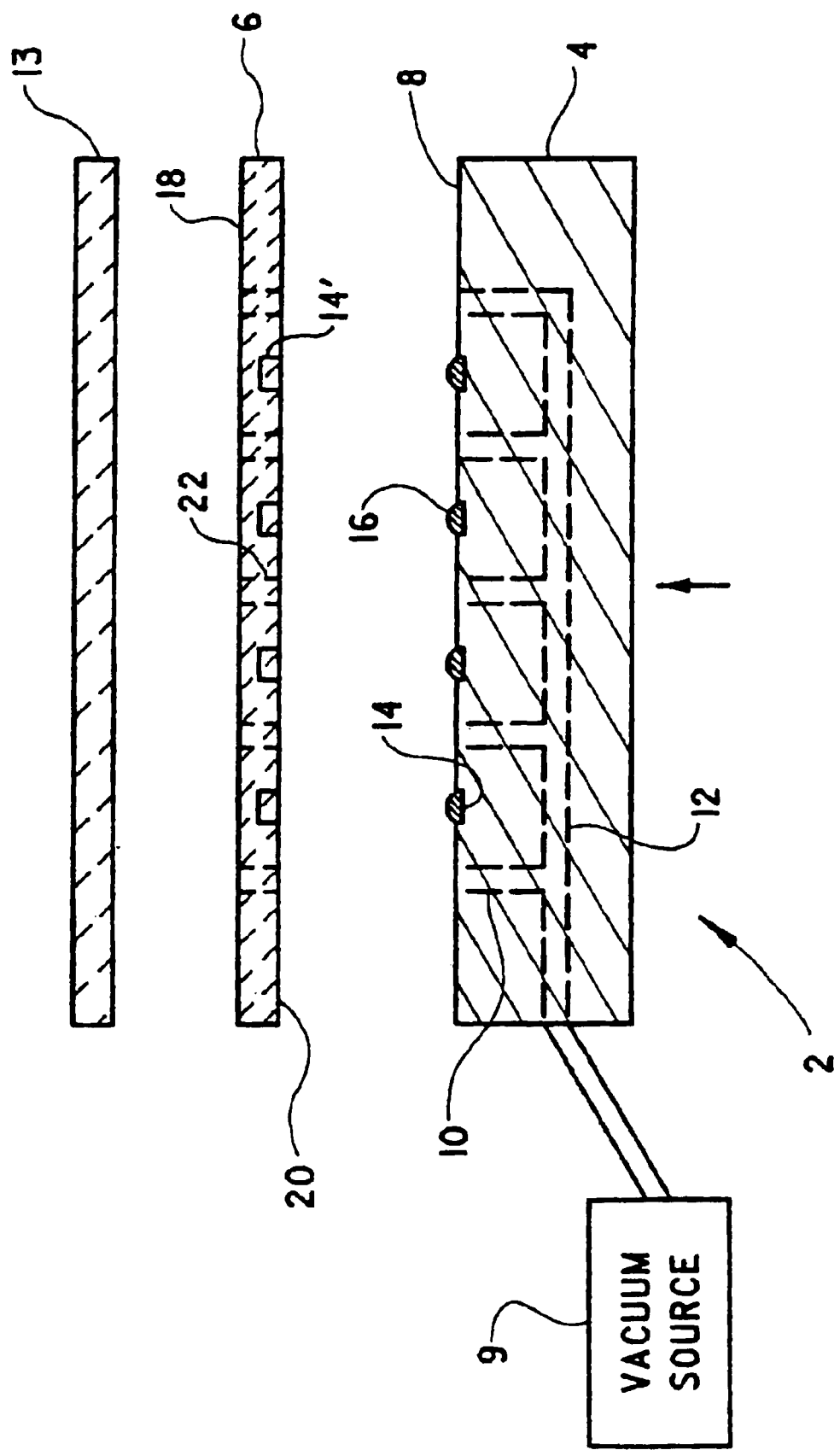

SAMPLE CHUCK WITH COMPOUND CONSTRUCTION

CROSS REFERENCE TO RELATED APPLICATION

The present application claims priority from U.S. Provisional Patent Application Ser. No. 60/304,325, filed Jul. 10, 2001.

BACKGROUND OF THE INVENTION

1. Field of the Invention

The present invention relates to a sample chuck or work piece for holding essentially flat samples, such as semiconductor wafers.

2. Background Art

Sample chucks have flat surfaces for receiving and holding samples, often semiconductor wafers, within equipment for processing or measurement purposes. Sample chucks are, for example, an integral component in measurement systems utilized to process semiconductor wafers. They are also used in products and in other equipment, such as photolithographic tools.

Sample chucks may perform a mechanical function, such as precisely holding a sample, or they may be used to move a sample, or they may be used to make controlled electrical contact to a sample. Occasionally, a chuck may be called upon to perform multiple functions.

Currently, sample chucks are constructed of ceramic materials, machined metals or semiconductor slabs. When formed from ceramic materials, sample chucks can be made having good flatness. However, sample chucks formed from ceramic materials form poor contact with a sample and such chucks have potential weight problems. When formed from machined metals, sample chucks have acceptable flatness and form good contact with samples. However, sample chucks formed from machined metals are susceptible to imparting contaminants to a sample, especially a sample semiconductor wafer. When formed from semiconductor slabs, sample chucks can be made having good flatness and minimal contaminants. However, sample chucks formed from semiconductor slabs are expensive to produce due to the requirement for a large slab of uniform material and the limitation on machining complex structures.

There is presently a need for a sample chuck which combines the best features of the chucks formed from ceramic materials, machined metals and semiconductor slabs, without having their respective drawbacks.

It is, therefore, an object of the present invention to provide a sample chuck where the parameters of flatness, contact formation, low weight and minimal or no contaminants are optimized at reasonable cost, especially for receiving all or part of a semiconductor wafer. Still other objects of the invention will become apparent to those of ordinary skill in the art upon reading and understanding the following detailed description.

SUMMARY OF THE INVENTION

Accordingly, we have invented a sample chuck for supporting sample semiconductor wafers during test. The sample chuck includes an upper layer formed from a semiconducting material laminated to a lower layer formed from a conducting material. A conductive bonding agent can be received between the upper and lower layers for forming a bond therebetween.

A surface of the lower layer that faces a surface of the upper layer when the upper and lower layers are laminated together can include at least one depression for receiving the bonding agent. Alternatively or additionally, a surface of the upper layer that faces a surface of the lower layer when the upper and lower layers are laminated together can include at least one depression for receiving the bonding agent.

The lower layer can include a vacuum path having a first end in fluid communication with a through-hole in the upper layer and a second end in fluid communication with a vacuum duct. The through-hole extends through the upper layer between the vacuum path and an exposed surface of the upper layer. The vacuum duct extends through the lower layer between the vacuum path and an exposed surface of the lower layer.

Preferably, the upper layer is a semiconductor wafer and the lower layer is a conductive metal that may or may not be contaminating to semiconductor wafers. Preferably, the surface of the upper layer that faces away from the lower layer is substantially planar.

A surface of the upper layer facing the lower layer can be metalized and/or doped with impurities for enhancing a conductivity of the upper layer and/or the bond between the upper layer and the lower layer.

BRIEF DESCRIPTION OF THE DRAWING

The drawing is a cross sectional view of a semiconductor wafer under test over an exploded cross-section of a sample chuck in accordance with the present invention.

DETAILED DESCRIPTION OF THE INVENTION

With reference to FIG. 1, a sample chuck 2 in accordance with the present invention is a laminated structure having a lower layer 4 and an upper layer 6 laminated to a top surface 8 of lower layer 4.

Lower layer 4 is formed from an electrically conductive material, such as aluminum, which provides low mass and weight, acceptable structural rigidity, and ease of manufacturing. One or more vacuum paths 10 may be formed in top surface 8 for connection to a vacuum source 9 via a vacuum duct 12, shown in phantom, which interconnects one or more vacuum paths 10, shown in phantom, to vacuum source 9. Vacuum source 9, vacuum paths 10 and vacuum duct 12 coact to distribute a vacuum to top surface 8 which can be utilized to secure a semiconductor wafer under test 13 to sample chuck 2.

The conductive material forming lower layer 4 is selected to provide a high quality electrical contact for uniformly distributing electrical current during electrical measurement or other electrical operations, e.g., electrical stressing. Top surface 8 of lower layer 4 is made planar by conventional techniques, such as milling or grinding. Since top surface 8 of lower layer 4 will not be in direct contact with semiconductor wafer under test 13, top surface 8 need not be as planar as a top surface of a sample chuck intended to directly contact semiconductor wafer under test 13.

Top surface 8 includes one or more depressions 14, such as grooves, rings, bores, and the like. Each depression 14 is filled with a bonding agent 16, such as an adhesive, a solder, a conductive adhesive, and the like. Bonding agent 16 is selected so that when received in depressions 14, bonding agent 16 extends above top surface 8 of lower layer 4, but does not flow under its own weight. Alternatively or additionally, instead of depressions 14 in top surface 8 of lower layer 4, depressions 14' can be formed in a back surface 20 of upper layer 6 for receiving bonding agent 16.

When sample chuck 2 is to hold semiconductor wafer under test 13, upper layer 6 is preferably a semiconductor wafer which has its electrical properties optimized to enhance electrical contact with semiconductor wafer under test 13. A top surface 18 of upper layer 6 can be formed to have a desired degree of planarity utilizing semiconductor wafer processing techniques known in the art.

Upper layer 6 preferably has through-holes 22, shown in phantom, formed therein by conventional semiconductor wafer processing techniques, such as ion milling. Preferably, the size and location of through-holes 22 is selected so that when upper layer 6 and lower layer 4 are laminated together, each through-hole 22 of upper layer 6 is in registry or fluid communication with a vacuum path 10 in lower layer 4. Other through-holes (not shown) may be formed in upper layer 6 for other purposes, such as for receiving a lifter pin which is utilized to separate the sample semiconductor wafer from top surface 18 of upper layer 6.

Back surface 20 of upper layer 6 can be metalized and/or doped with impurities to enhance its conductive and/or adhesive properties. Back surface 20 can be metalized by sputtering or vacuum deposition techniques known in the art of semiconductor wafer processing. Back surface 20 can also be doped with impurities by ion implantation.

Sample chuck 2 is formed by laminating upper layer 6 and lower layer 4 together. More specifically, bonding agent 16 is received in depressions 14 of lower layer 4 and/or depressions 14' of upper layer 6. Thereafter, back surface 20 of upper layer 6 and top surface 8 of lower layer 4 are moved together such that bonding agent 16 flows between back surface 20 and top surface 8 to form a permanent or semi-permanent bond between upper layer 6 and lower layer 4. Preferably, the volume of bonding agent 16 utilized is selected to avoid bonding agent 16 from flowing into through-holes 22 or vacuum paths 10 when upper layer 6 and lower layer 4 are laminated together.

Depending on the bonding agent 16 utilized, further processing of sample chuck 2 may be required. For example, if tin-indium solder is used as bonding agent 16, once back surface 20 is received on top surface 8 with through-holes 22 and vacuum paths 10 aligned, sample chuck 2 is heated sufficiently to cause the solder to melt and wet back surface 20 of upper layer 6 thereby forming a semi-permanent attachment between upper layer 6 and lower layer 4.

The present invention permits optimization of lower layer 4 to balance rigidity, weight and conductivity. More specifically, it enables the material forming lower layer 4 to be selected based on a compromise between a high level of conductivity for electrical performance and low mass for high speed motion. Since lower layer 4 is not in contact with the sample semiconductor wafer, the conductive material forming lower layer 4 can be selected from a wider range of material choices, some of which, heretofore, were undesirable for use with a sample chuck utilized to hold semiconductor wafers under test 13. Since upper layer 6 and lower layer 4 are laminated together, top surface 8 of lower layer 4 need not meet the rigid flatness requirements required of the top surfaces of prior art sample chucks. This allows more flexibility in the design of lower layer 4, more flexibility in the choice of materials forming lower layer 4, and, possibly, lower cost.

The use of a semiconductor wafer for upper layer 6 inherently provides a very flat top surface 18 and eliminates contamination of semiconductor wafers under test 13 from the conductive material forming lower layer 4. It is to be appreciated that forming sample chuck 2 from semiconducting material alone is not desirable due to the cost and increase mass of such solution. Additionally, forming sample chuck 2 from semiconductor material does not optimize the electrical conductivity of sample chuck 2. However, laminating upper layer 6 formed from a semiconductor wafer to lower layer 4 formed from a conductive material combines the best features of both materials.

The invention has been described with reference to the preferred embodiment. Obvious combinations and alterations will occur to others upon reading and understanding the preceding detailed description. It is intended that the invention be construed as including all such modifications and alterations insofar as they come within the scope of the appended claims or the equivalents thereof.

The invention claimed is:

1. A sample chuck for supporting sample semiconductor wafers during testing, the sample chuck comprising an upper layer formed from a semiconducting material laminated to a lower layer formed from a conducting material, wherein:

the lower layer has a vacuum path having a first end in fluid communication with a through-hole in the upper layer and a second end in fluid communication with a vacuum duct;

the through-hole extends through the upper layer between the vacuum path and an exposed surface of the upper layer; and the vacuum duct extends through the lower layer between the vacuum path and an exposed surface of the lower layer.

2. The sample chuck as set forth in claim 1, further including a conductive bonding agent received between the upper and lower layers and forming a bond therebetween.

3. The sample chuck as set forth in claim 2, wherein a surface of the lower layer that faces a surface of the upper layer when the upper and lower layers are laminated together includes at least one depression for receiving the bonding agent.

4. The sample chuck as set forth in claim 2, wherein a surface of the upper layer that faces a surface of the lower layer when the upper and lower layers are laminated together includes at least one depression for receiving the bonding agent.

5. The sample chuck as set forth in claim 1, wherein the upper layer is a semiconductor wafer and the lower layer is a conductive metal.

6. The sample chuck as set forth in claim 5, wherein the conductive metal is contaminating to semiconductor wafers.

7. The sample chuck as set forth in claim 1, wherein the surface of the upper layer that faces away from the lower layer is substantially planar.

8. The sample chuck as set forth in claim 1, wherein a surface of the upper layer facing the lower layer is doped with impurities for enhancing (i) a conductivity of the upper layer and/or (ii) the bond between the upper layer and the lower layer.

9. The sample chuck as set forth in claim 1, wherein a surface of the upper layer facing the lower layer is metalized for enhancing (i) a conductivity of the upper layer and/or (ii) the bond between the upper layer and the lower layer.

* * * * *